United States Patent [19]

Whartenby et al.

[11] Patent Number: 4,554,514

[45] Date of Patent: Nov. 19, 1985

[54] PREDISTORTION CIRCUIT WITH FEEDBACK

[75] Inventors: James C. Whartenby, Princeton; Mahesh Kumar, Dayton, both of N.J.

[73] Assignee: RCA Corporation, Princeton, N.J.

[21] Appl. No.: 685,241

[22] Filed: Dec. 21, 1984

[51] Int. Cl.$^4$ .......................... H03F 1/26; H03F 1/32; H03C 1/06; H04B 1/12

[52] U.S. Cl. ................................ 330/149; 332/37 D; 455/296; 330/294

[58] Field of Search ....................... 330/149, 294, 107; 332/37 R, 37 D; 455/295, 296, 310

[56] References Cited

U.S. PATENT DOCUMENTS

| | | | |
|---|---|---|---|
| 4,268,802 | 5/1981 | Fisher et al. | 332/37 D |
| 4,329,655 | 5/1982 | Nojima et al. | 330/149 |
| 4,373,209 | 2/1983 | Kaneda | 455/208 |
| 4,383,334 | 5/1983 | Epsom | 455/295 |

Primary Examiner—James B. Mullins
Assistant Examiner—G. Wan
Attorney, Agent, or Firm—Joseph S. Tripoli; Robert L. Troike; Raymond E. Smiley

[57] ABSTRACT

A predistortion circuit for a microwave power amplifier which exhibits phase and amplitude nonlinearities and has a small signal gain equal to a. The phase distortion circuit includes a 180° coupler, a first coupler for coupling a given fraction of the input power to the 180° coupler and a second coupler for coupling the given fraction of the power output from the amplifier, reduced by a, to the 180° coupler. The 180° coupler has a difference output port at which a signal appears which corresponds substantially to the difference in phase between the two signals input to the 180° coupler and has a sum port at which a signal appears which corresponds substantially to the sum in amplitude between the two signals input thereto.

A phase change circuit and attenuator are coupled between the first coupler and input to the power amplifier. Signals related to the signals produced at the difference port and sum port of the 180° coupler are utilized to control the amount of phase change in the phase change circuit and the amount of attenuation in the attenuator circuit to thereby reduce the phase and amplitude nonlinearities of the signal produced by the power amplifier.

8 Claims, 3 Drawing Figures

PREDISTORTION CIRCUIT WITH FEEDBACK

BACKGROUND OF INVENTION

1. Field of Invention

This invention is concerned with predistortion circuits used for linearizing power amplifiers, and more particularly, with such circuits which operate at microwave frequencies.

2. Description of Prior Art

Microwave power amplifiers of the traveling wave tube type or solid state type used in ground station transmitters and communication satellites should, ideally, be highly efficient and provide linear amplification. The performance of these amplifiers is undesirably limited by amplitude and phase nonlinearities. In order to reduce amplitude and phase distortions of the signals generated in the microwave power amplifiers and obtain higher carrier to intermodulation distortion products (C/I) ratios, amplifiers are conventionally operated well below saturation with consequent loss of efficiency.

In traveling wave tube amplifiers (TWTA) or solid state power amplifiers (SSPA), for example, there are two sources of nonlinearities: (a) amplitude nonlinearity and (b) phase nonlinearity. The intermodulation distortion (IMD) generated by phase nonlinearity is orthogonal to IMD generated by amplitude nonlinearity.

Predistortion is one of the best ways of the many methods of nonlinear compensation. In this technique, the inverse amplitude and phase nonlinearities are added to the TWTA/SSPA input signal to cancel the TWTA/SSPA output nonlinearities. A predistortion circuit should be capable of generating both inverse amplitudes and phase nonlinearities to achieve a substantial reduction in the IMD products.

Most of the prior art distortion circuits have used either diodes or MESFETs as the nonlinear elements along with associated complex circuits, such as phase shifters, attenuators, etc. One prior art circuit as exemplified by U.S. patent application Ser. No. 608,415, filed May 9, 1984, employs two signal paths, one to change the relative phase angle and the other to introduce a predetermined amount of non-linear distortion. A potential problem with this type of circuit is that as the active and passive circuit elements age, they may change characteristics such that the IMD will increase and degrade the performance of the amplifier.

SUMMARY OF THE INVENTION

In accordance with a preferred embodiment of the present invention, a predistortion circuit for a power amplifier which exhibits phase and amplitude nonlinearities at its output as a function of input power comprises in combination: an input terminal coupled to receive a signal to be amplified and an output terminal coupled to the input of the power amplifier. The combination also comprises means coupled to the input terminal for producing a first signal which is a predetermined fraction X of the signal to be amplified, means coupled to the output of the power amplifier for producing a second signal which is the fraction X of the output power of the amplifier reduced by a value equal to the gain of the amplifier at a small value of input signal, means responsive to the first and second signals for producing a third signal which is substantially proportional to the phase difference between the first and second signals and producing a fourth signal which is substantially proportional to the sum of the first and second signals and means coupled between the input terminal and the output terminal and responsive to the third and fourth signals applied thereto for changing the phase and amplitude of the signal passing therethrough to compensate for nonlinearities of the power amplifier such as to reduce the phase and amplitude nonlinearities in the amplifier output signal from the power amplifier.

DETAILED DESCRIPTION

Figure 1:
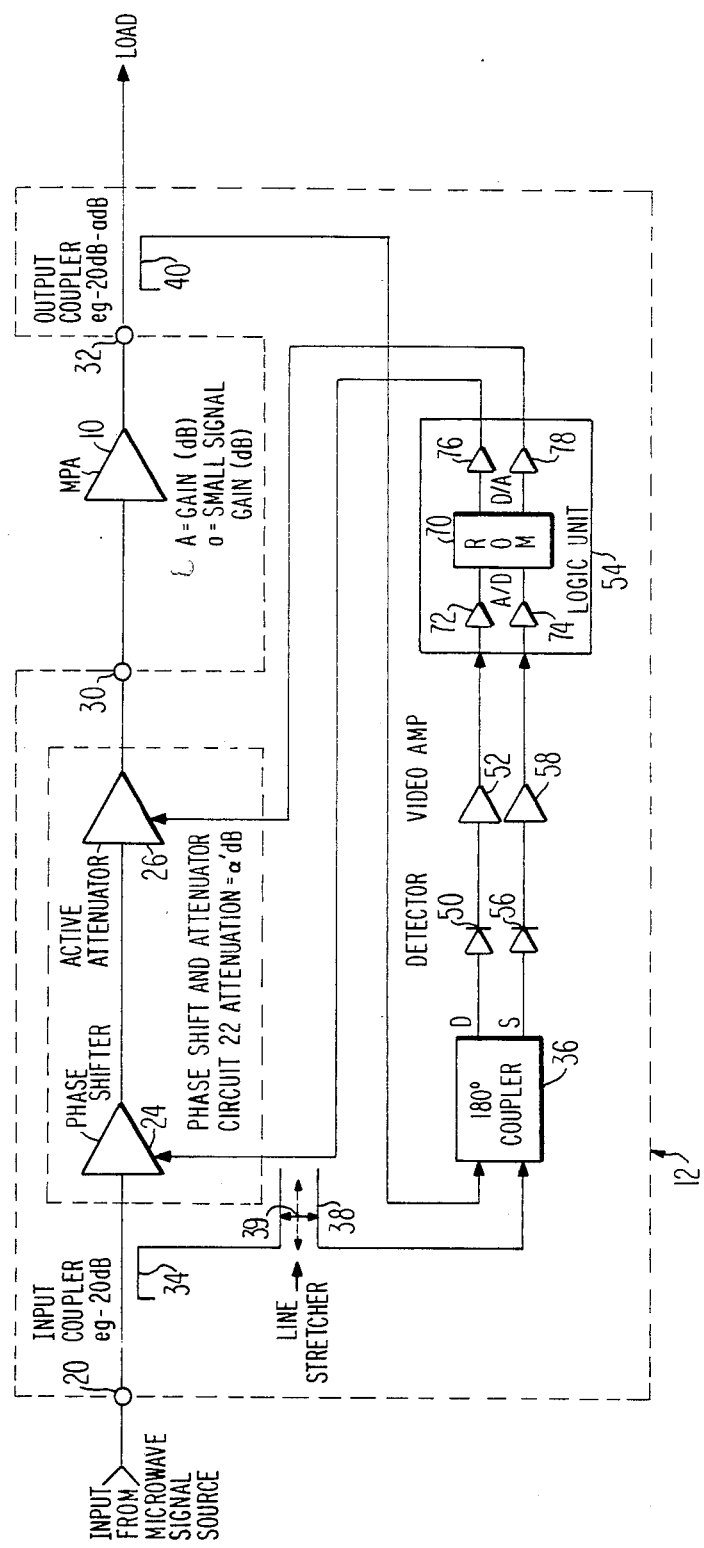
FIG. 1 is a predistortion circuit employing feedback in electrical schematic form in accordance with a preferred embodiment of the present invention and a following amplifier circuit having distortion which is to be compensated.

Referring to FIG. 1 all elements illustrated therein except microwave power amplifier 10 comprise a predistortion circuit 12 in accordance with a preferred embodiment of the present invention for the purpose of compensating nonlinearities present in microwave power amplifier 10.

An exemplary microwave power amplifier is the Model 1653H Traveling Wave Tube (TWT) microwave power amplifier manufactured by Hughes Electron Dynamics Division of Hughes Aircraft, Torrance, Calif. Alternatively, the amplifier could be another TWT microwave power amplifier or a solid state microwave power amplifier. Such amplifiers typically have amplitude and phase distortion as illustrated in waveforms 14 and 16 in FIGS. 2 and 3, respectively. Amplifier 10 has a gain A which varies as a function of input power where A may be on the order of 60dB, for example.

Figure 2:
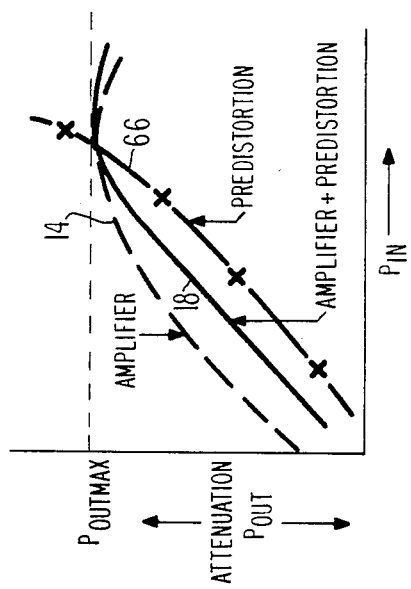

Turning first to FIG. 2, ideally the gain A of amplifier 10 is linear at all values of input power until some maximum output power $P_{OUTMAX}$ is reached beyond which point further increases in input power do not result in any further output power. Waveform 18 representing the result of utilizing the predistortion circuit 12 of FIG. 1 and is substantially equal to the ideal waveform. Clearly, waveform 14 is not such an idealistic waveform but rather illustrates nonlinearities in the form of variable amplification at lower output levels below $P_{OUTMAX}$ and then an actual decrease in output power with further input power increases.

Figure 3:
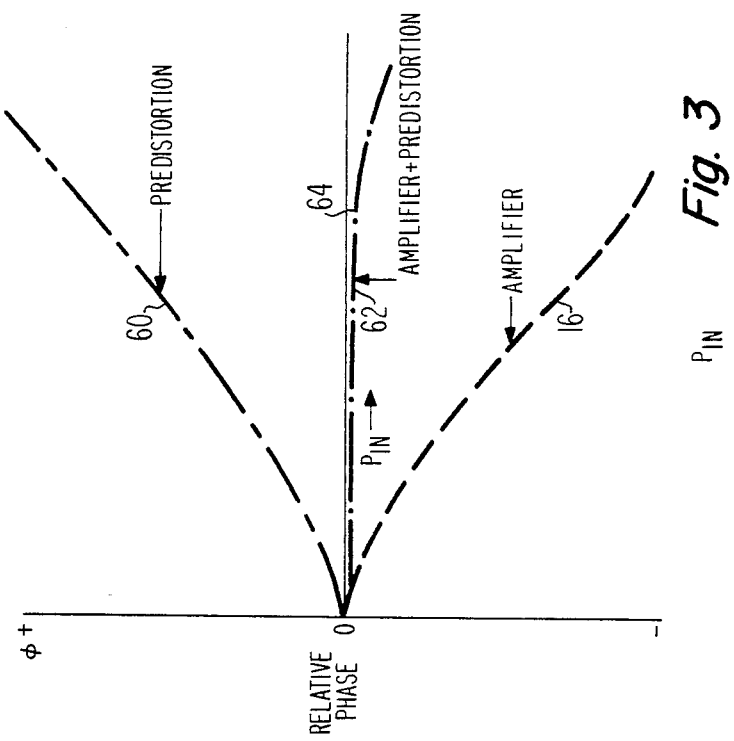
FIGS. 2 and 3 are sets of plots illustrating amplitude and phase distortion versus power input, respectively, of the FIG. 1 predistortion circuit and the following amplifier circuit.

Similarly, with respect to FIG. 3, ideally there should be no phase change in signal passing through microwave power amplifier 10 at all levels of input power. In fact, as waveform 16 illustrates there is increasing phase lag with increasing levels of input power. The purpose of circuit 12 is to compensate for the illustrated amplitude and phase distortion.

Returning to FIG. 1, predistortion circuit input terminal 20 is adapted to receive a modulated microwave signal from a suitable source (not shown) to be amplified by amplifier 10. Terminal 20 is coupled to phase shift and attenuator circuit 22. Circuit 22 may consist of series coupled controllable phase shift circuit 24 and controllable attenuator 26. Alternatively, circuit 22 may be of the type described in U.S. Pat. No. 4,297,641 issued Oct. 27, 1981 to F. Sterzer and assigned to applicants' assignee. That patent is incorporated herein by reference.

Circuit 22 is coupled to terminal 30 which is connected to the input of microwave power amplifier 10. The output of microwave power amplifier 10 is coupled to a terminal 32 which is connected to any suitable load (not shown). A power coupler 34 of conventional design at input terminal 20 couples a portion of the power input to terminal 20' to a 180° coupler 36 via a line stretcher 38. Coupler 34 couples some given fraction X of the input power (for example, −20 dB below the input power at terminal 20) to coupler 36.

A coupler 40 at the output of amplifier 10 is coupled to the second input of 180° coupler 36. Coupler 40 couples the same fraction X of output signal as does coupler 34 reduced by the small signal amplification factor, a, of amplifier 10. To understand the small signal amplification factor, reference is again made to FIG. 2 wherein it has been noted that waveform 14 is nonlinear. At low levels of input power (to the left in FIG. 2) the gain of amplifier 10, 10 log ($P_{OUT}/P_{IN}$), is at a maximum and decreases with increasing input power. It is the gain at low levels of input power that is referred to as the small signal amplification factor. If the small signal amplification factor, a, of amplifier 10 is, for example 65 db, coupler 40 couples X−a in dB (where for example X= −20 dB) of the output power to coupler 36.

The purpose of line stretcher 38 is to insure that the two signals applied to coupler 36 are in phase with regard to the phase delay imposed by the time of passage through circuit 22 and amplifier 10, ignoring the phase shift purposely imposed by shifter 24 and the unwanted phase shift in amplifier 10 at higher input signal levels. Line stretcher 38 is typically made with two spaced apart sections of a transmission line and with a short as indicated by double ended arrow 39 thereacross at an appropriate point to provide the proper phase shift. A suitable 180° coupler 36 is one described in U.S. Pat. No. 4,394,629 issued July 19, 1983 to M. Kumar et al. and assigned to applicants' assignee. That patent is incorporated herein by reference. Coupler 36 has two input ports as described in the aforementioned U.S. Pat. No. 4,394,629 and has two output ports, a difference port D and a sum port S. The operation of coupler 36 is such that if both input signals thereto are of identical phase and amplitude no output signal will appear at the D output terminal and all the input power (less a slight loss in coupler 36) will appear at S output terminal. At all other combinations of input signals some signal will appear at both the D and the S output terminals, the total output power being equal to the total input power less than the aforementioned slight loss.

The D output terminal of coupler 36 is coupled to a detector 50 which detects the microwave frequency leaving the envelope of the signal appearing at terminal D of coupler 36. The output of detector 50 is coupled to a video (wideband) amplifier 52, the output of which is coupled to a logic unit 54. Similarly, output terminal S of coupler 36 is coupled to a detector 56. The envelope detected output of detector 56 is coupled to a video amplifier 58, the output of which is also coupled to logic unit 54. Logic unit 54 has two outputs connected respectively to the control input of phase shifter 24 and the control input of attenuator 26.

Logic unit 54 may take several forms. It may for example be a microprocessor with an appropriate stored program. It may take the form—and most likely will take the form—of a read-only memory (ROM) 70 preceded by appropriate analog-to-digital circuits 72 and 74 and followed by digital-to-analog converters 76 and 78. Circuits 72 and 74 are connected to receive signals from video amplifiers 52 and 58, respectively, to address locations in ROM 70 in accordance with the values of signals appearing at the outputs of amplifiers 52 and 58. At the output of the ROM 70, digital-to-analog converters 76 and 78 are coupled to receive digital information from ROM 70 and are coupled to the control inputs of phase shifter 24 and attenuator 26, respectively. The idea is that for every set of analog signals appearing at the outputs of amplifiers 51 and 58 there is an appropriate set of control voltages which will cause circuit 22 to predistort the signal applied at terminal 20 so that the power amplified signal appearing at terminal 32 is not distorted or is greatly reduced in distortion relative to the distortions present in the absence of circuit 12. ROM 70 contains in its various locations the digital equivalents of the control signals.

Operation of the circuit of FIG. 1 will now be described assuming first the unrealistic assumption that amplifier 10 produces no phase and amplitude distortion. That is, at all levels of input power at terminal 20 below that producing $P_{OUTMAX}$ (FIG. 2) amplifier 10 produces an output signal at a constant gain, a, and produces no input power related phase shift. Of course, there is a constant phase shift due to the time required for signal passing through phase shift circuit 24, attenuator 26 and amplifier 10, but that is compensated for by line stretcher 38.

Therefore, with line stretcher 38 properly adjusted, equal valued and in-phase signals are applied to coupler 36 resulting in no output at the D output thereof and a signal having a value double the input signal (for purposes of this discussion losses in coupler 36 will be ignored) at the S output. Under these conditions, logic unit 54 is directed by the resulting signal value applied thereto to create no phase shift in phase shifter 24 and a predetermined attenuation such that the resultant gain of amplifier 10 and predistortion circuit 12 becomes A' where A' is equal to A less the attenuation a' in circuit 22. Under the idealized conditions stated, attenuator 26 should produce no attenuation but since amplifier 10 in reality tends to be nonlinear in amplification such that the gain A of amplifier 10 reduces as the input power is increased at terminal 20, attenuator 26 is set to attenuate less as the input power is increased. Thus attenuator 26 provides a decreasing attenuation with increasing input power at terminal 20.

Such an idealized condition as above assumed occurs only at very low levels of input power. In reality, amplifier 10 has substantial amplitude (power) and phase distortion at various values of input power as illustrated by waveforms 14 and 16, FIGS. 2 and 3, respectively. These amplifier nonlinearities of phase and amplitude, in turn, cause very undesirable intermodulation distortion (IMD) products to be present at the output of amplifier 10 at higher levels of input power in the absence of a predistortion circuit such as 12.

As a result of the amplitude and phase nonlinearities in amplifier 10, the signals applied to coupler 36 are typically not equal either in phase or amplitude to one another. The 180° coupler 36 produces, at its D output, signals substantially equal only to differences in phase shift between the signal applied at terminal 20 and the signal appearing at terminal 32 while output S relates to the variation in gain created by components between terminals 20 and 32.

The magnitude of the signals appearing at the D and S outputs of coupler 36 or more particularly the magnitude of signals appearing at the output of amplifiers 52 and 58 are determinative of phase and amplitude correction necessary to be applied to phase shifter 24 and attenuator 26, respectively.

Logic unit 54 is necessary because of two reasons: (1) Phase shifter 24 in fact produces some amplification or attenuation depending on the type of phase shifter 24 employed (active or passive) and the amount of phase shift performed therein so that the amount of attenuation required in attenuator 26 is a function both of the signal appearing at terminal S of coupler 36 and the amount of amplification or attenuation created by phase shifter 24 as a result of the magnitude of signal at the D output of coupler 36, and (2) the D output of coupler 36 depends to some extent on the amount of output at the S terminal and vice versa which are not absolutely due to phase nonlinearities in amplifier 10 and amplitude nonlinearities in amplifier 10, respectively.

As mentioned above one form of logic unit 54 is simply a look-up table which may include a read-only memory forming a programmed storage means where the various values in the read-only memory may be determined simply by operating amplifier 10 at various levels of input signal at terminal 20 and determining what specific amount of phase shift and attenuation is required to linearize amplifier 10 and storing the corresponding values into read-only memory 54. Alternatively, depending on the level of linearity required the ROM values can be determined by an exemplary amplifier 10 and then the same values used for all amplifier 10's. In any event, logic 54 under control of signals from coupler 36 causes phase shifter 24 to change as a function of input power as indicated by waveform 60, FIG. 3.

It will be noted that waveform 60 is essentially a mirror image of waveform 16 in FIG. 3 such that the output of amplifier 10 due to various levels of input power is maintained at a relative phase of zero as indicated by waveform 62, FIG. 3. Point 64 in FIG. 3 marks the point at which amplifier 10 is producing maximum output power. Input power beyond that point may cause distortion but such input power is not expected to be received by amplifier 10. Similarly, attenuator 26 under control of logic unit 54 produces a signal having decreasing attenuation with increasing input power at terminal 20 as indicated by waveform 66, FIG. 2. It will be understood that waveform 66 is illustrated in units of attenuation on the vertical axis versus input power ($P_{IN}$) on the horizontal axis with increasing units of attenuation toward the horizontal axis rather than increasing units of attenuation away from the horizontal axis as is the case with the output power signal $P_{OUT}$. The resulting power signal produced by amplifier 10 in conjunction with predistortion circuit 12 as a result of the varying attenuation signal produced by attenuator 26 and varying phase produced by phase shifter 24 is essentially a linear waveform 18, FIG. 2, up to a point nearly $P_{OUTMAX}$.

Because of the feedback nature of the circuit of FIG. 1 aging of any of the components including the phase shifter 24, active attenuator 26 and microwave power amplifier 10 does not result in degradation of the predistortion circuit operation.

What is claimed is:

1. A predistortion circuit, for a power amplifier exhibiting phase and amplitude nonlinearities at its output as a function of input power, comprises in combination:
   an input terminal coupled to receive a signal to be amplified and an output terminal coupled to the input of said power amplifier;
   means coupled to said input terminal for producing a first signal which is a predetermined fraction X of the signal to be amplified;
   means coupled to the output of said power amplifier for producing a second signal which is said fraction X of the output power of said amplifier reduced by a value equal to the gain of said amplifier at a small value of input signal,
   means responsive to said first and second signals for producing a third signal which is substantially proportional to the phase difference between said first and second signals and producing a fourth signal which is substantially proportional to the sum of the first and second signals; and
   means coupled between said input terminal and said output terminal and responsive to said third and fourth signals applied thereto for changing the phase and amplitude of the signal passing therethrough to compensate for nonlinearities of said power amplifier such as to reduce the phase and amplitude nonlinearities in said amplifier output signal from said power amplifier.

2. The combination as set forth in claim 1 wherein said power amplifier is a microwave power amplifier and wherein said signal to be amplified is a signal in the microwave frequency range.

3. The combination as set forth in claim 2 wherein said means responsive to said first and second signals comprises a 180° coupler.

4. The combination as set forth in claim 2 wherein said means for changing said amplitude comprises an adjustable attenuator.

5. The combination as set forth in claim 3 wherein said means for changing said amplitude comprises an adjustable attenuator.

6. The combination as set forth in claim 2 wherein said means coupled between said input terminal and said output terminal comprises a means responsive to a pair of control signals for altering the gain and phase of input signals applied thereto in accordance with the values of signals applied thereto and further comprises a programmed storage means addressed by said third and fourth signals for generating said pair of control signals at values to reduce said phase and amplitude distortion of the output signal produced by said power amplifier.

7. The combination as set forth in claim 3 wherein said means coupled between said input terminal and said output terminal comprises a means responsive to a pair of control signals for altering the gain and phase of input signals applied thereto in accordance with the values of signals applied thereto and further comprises a programmed storage means addressed by said third and fourth signals for generating said pair of control signals at values to reduce said phase and amplitude distortion of the output signal produced by said power amplifier.

8. The combination as set forth in claim 5 wherein said means coupled between said input terminal and said output terminal comprises a means responsive to a pair of control signals for altering the gain and phase of input signals applied thereto in accordance with the values of signals applied thereto and further comprises a programmed storage means addressed by said third and fourth signals for generating said pair of control signals at values to reduce said phase and amplitude distortion of the output signal produced by said power amplifier.

* * * * *